(12) United States Patent
Stachowiak et al.

(10) Patent No.: US 6,908,679 B2
(45) Date of Patent: *Jun. 21, 2005

(54) HEAT TREATABLE COATED ARTICLE WITH NIOBIUM ZIRCONIUM INCLUSIVE IR REFLECTING LAYER AND METHOD OF MAKING SAME

(75) Inventors: Grzegorz Stachowiak, Ann Arbor, MI (US); Ratchaneekorn Chonlamaitri, Canton, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 45 days.

This patent is subject to a terminal disclaimer.

(21) Appl. No.: 10/672,065

(22) Filed: Sep. 29, 2003

(65) Prior Publication Data

US 2004/0214013 A1 Oct. 28, 2004

Related U.S. Application Data

(63) Continuation-in-part of application No. 10/423,058, filed on Apr. 25, 2003, and a continuation-in-part of application No. 10/434,470, filed on May 9, 2003.

(51) Int. Cl.[7] ................................................. B32B 9/00
(52) U.S. Cl. ...................... 428/428; 428/432; 428/699; 428/704; 428/698; 428/701; 428/472; 428/469
(58) Field of Search .......................... 428428/428, 432, 428428/433, 699, 701, 702, 704

(56) References Cited

U.S. PATENT DOCUMENTS

| | | |
|---|---|---|
| 3,597,050 A | 8/1971 | Plumat |
| 4,071,649 A | 1/1978 | Jacquemin et al. |
| 4,462,883 A | 7/1984 | Hart |
| 4,894,290 A | 1/1990 | Chesworth et al. |
| 5,059,295 A | 10/1991 | Finley |
| 5,201,926 A | 4/1993 | Szczyrbowski et al. |
| 5,229,194 A | 7/1993 | Lingle et al. |
| 5,318,685 A | 6/1994 | O'Shaughnessy |
| 5,342,675 A | 8/1994 | Kobayashi et al. |
| 5,387,433 A | 2/1995 | Balian et al. |
| 5,395,698 A | 3/1995 | Neuman et al. |
| 5,407,733 A | 4/1995 | Bjornard et al. |
| 5,514,476 A | 5/1996 | Hartig et al. |
| 5,543,229 A | 8/1996 | Ohsaki et al. |
| 5,557,462 A | 9/1996 | Hartig et al. |
| 5,837,108 A | 11/1998 | Lingle et al. |
| 5,935,702 A | 8/1999 | Macquart et al. |
| 5,948,538 A | 9/1999 | Brochot et al. |
| 6,086,210 A | 7/2000 | Krisko et al. |

(Continued)

FOREIGN PATENT DOCUMENTS

| | | |
|---|---|---|
| WO | WO 01/21540 | 3/2001 |
| WO | WO 2004/011382 | 2/2004 |

OTHER PUBLICATIONS

U.S. Appl. No. 10/423,058, filed Apr. 25, 2003.
U.S. Appl. No. 10/434,470, filed May 9, 2003.
"Heat Insulating Glass Which Can Be Thermally Worked", Hironobu, 05124839, Oct. 1991.

*Primary Examiner*—Deborah Jones
*Assistant Examiner*—G. Blackwell-Rudasill
(74) *Attorney, Agent, or Firm*—Nixon & Vanderhye P.C.

(57) ABSTRACT

A coated article is provided so as to include a solar control coating having an infrared (IR) reflecting layer sandwiched between at least a pair of dielectric layers. The IR reflecting layer includes NbZr and/or $NbZrO_x$ in certain embodiments of this invention. The use of such materials as an IR reflecting layer(s) allows the coated article to have good corrosion resistance to alkaline solutions, good mechanical performance such as scratch resistance, and/or good color stability (i.e., a low $\Delta E^*$ value(s)) upon heat treatment (HT). The coated article may or may not be heat treated in different embodiments of the invention.

75 Claims, 2 Drawing Sheets

U.S. PATENT DOCUMENTS

| | | |
|---|---|---|
| 6,352,755 B1 | 3/2002 | Finley et al. |
| 6,475,626 B1 | 11/2002 | Stachowiak |
| 6,495,263 B2 | 12/2002 | Stachowiak |
| 6,514,620 B1 | 2/2003 | Lingle et al. |
| 6,524,714 B1 | 2/2003 | Neuman et al. |
| 6,558,800 B1 | 5/2003 | Stachowiak |
| 6,576,349 B2 | 6/2003 | Lingle et al. |
| 2002/0086164 A1 * | 7/2002 | Anzaki et al. ............. 428/432 |
| 2002/0192473 A1 | 12/2002 | Gentilhomme et al. |

* cited by examiner

HEAT TREATABLE COATED ARTICLE WITH NIOBIUM ZIRCONIUM INCLUSIVE IR REFLECTING LAYER AND METHOD OF MAKING SAME

This application is a continuation-in-part (CIP) of each of U.S. Ser. No. 10/423,058, filed Apr. 25, 2003; and Ser. No. 10/434,470, filed May 9, 2003, the disclosures of which are all hereby incorporated herein by reference; priority is claimed on all of these parent applications.

This invention relates to coated articles that include at least one niobium zirconium oxide ($NbZrO_x$) inclusive infrared (IR) reflecting layer, and/or a method of making the same. Such coated articles may be used in the context of monolithic windows, insulating glass (IG) window units, laminated windows, and/or other suitable applications.

BACKGROUND AND SUMMARY OF THE INVENTION

Solar control coatings having a layer stack of glass/$Si_3N_4$/NiCr/$Si_3N_4$ are known, where the metallic NiCr layer is the sole infrared (IR) reflecting layer in the coating. In certain instances, the NiCr layer may be nitrided. Unfortunately, while such layer stacks with NiCr IR reflecting layers provide efficient solar control and are overall good coatings, they sometimes are lacking in terms of: (a) corrosion resistance to acid (e.g., HCl boil); (b) mechanical performance such as scratch resistance; and/or (c) color stability upon heat treatment for tempering, heat bending, or the like (i.e., too high of $\Delta E^*$ value(s)). For example, a known heat treatable coated article having a layer stack of glass/$Si_3N_4$/NiCr/$Si_3N_4$ has rather high glass side reflective $\Delta E^*$ value above 5.0 after heat treatment (HT) at 625 degrees C. for about ten minutes. This high glass side reflective $\Delta E^*$ value means that the coated article when HT will not approximately match its non-HT counterpart with respect to glass side reflective color after such HT.

Accordingly, there exists a need in the art for a coated article that has improved characteristics with respect to (a), (b) and/or (c) compared to a conventional layer stack of glass/$Si_3N_4$/NiCr/$Si_3N_4$, but which still is capable of acceptable thermal performance (e.g., blocking a reasonable amount of IR and/or UV radiation) and/or heat treatment. It is a purpose of this invention to fulfill at least one of the above-listed needs, and/or other needs which will become apparent to the skilled artisan once given the following disclosure.

A recent development by the instant inventor, set forth in U.S. patent application Ser. No. 10/338,878, filed Jan. 9, 2003 (hereby incorporated herein by reference), is the use of a layer stack of glass/$Si_3N_4$/$NbN_x$/$Si_3N_4$, where the $NbN_x$ is used as the IR reflecting layer. This layer stack is advantageous with respect to the aforesaid glass/$Si_3N_4$/NiCr/$Si_3N_4$ layer stack in that coated articles with the $NbN_x$ IR reflecting layer realize improved color stability upon heat treatment (i.e., lower $\Delta E^*$ values) and/or improved durability.

While coated articles having a layer stack of glass/$Si_3N_4$/$NbN_x$/$Si_3N_4$ represent improvements in the art, they are sometimes lacking with respect to chemical durability. This is because, for example, $NbN_x$ suffers damage when exposed to certain chemicals such as alkaline solutions, e.g., upon exposure to a one hour NaOH boil test for measuring durability. In commercial use, pinholes can form in the outer silicon nitride layer thereby exposing the $NbN_x$ in certain areas; if it is damaged by alkaline solutions this can lead to durability issues. For example, certain photographs in U.S. patent application Ser. No. 10/370,060, filed Feb. 21, 2003 (hereby incorporated herein by reference) illustrate that Nb and $NbN_x$ layers are often damaged by the one hour NaOH boil test (one hour boil in solution including about 0.1 normal NaOH solution—0.4% NaOH mixed with water—at about 195 degrees F.). For the boil test, see ASTM D 1308-87, incorporated herein by reference.

Another recent development is the use of $CrN_x$ as an IR reflecting layer in such a layer stack. Unfortunately, while $CrN_x$ realizes exceptional chemical durability, its thermal performance is not so good.

Moreover, commonly owned Ser. No. 10/370,060 discloses the use of NbCr and $NbCrN_x$ as IR reflecting layers. While NbCr and $NbCrN_x$ both realize excellent durability, there is a trade-off between chemical durability and thermal performance in NbCr and $NbCrN_x$ based coatings. In particular, alloys with higher Cr content have excellent chemical durability, but better thermal performance is achievable for lower Cr contents. Thus, a compromise has to be made between chemical durability and thermal performance when using coatings which utilize NbCr or $NbCrN_x$ IR reflecting layers.

Thus, it will be apparent that there exists a need in the art for coated articles which are capable of achieving acceptable solar control performance, and which are also durable upon exposure to certain chemicals such as acids and/or alkaline solutions (e.g., NaOH boil test).

In certain example embodiments of this invention, a coating or layer system is provided which includes an infrared (IR) reflecting layer comprising niobium zirconium (NbZr) and/or niobium zirconium oxide ($NbZrO_x$) sandwiched between at least a substrate and a dielectric layer. Surprisingly, it has been found that the addition of Zr to Nb causes the resulting coated articles to realize excellent chemical and mechanical durability, and also excellent thermal performance. Moreover, it has surprisingly been found that oxidizing the NbZr (to form $NbZrO_x$) allows even better color stability upon heat treatment (i.e., lower $\Delta E^*$ value(s)) compared to situations where the NbZr is not oxidized.

In certain example $NbZrO_x$ embodiments, it has unexpectedly been found that oxiding (e.g., partial oxiding) is particularly beneficial with respect to lowering $\Delta E^*$ value(s). For example, in certain example embodiments, it has been found that partial oxiding of the NbZr is particularly beneficial when a particular range of oxygen to metal content in the layer is achieved. For example, the atomic ratio in the layer of oxygen to the total combination of Nb and Zr may be represented, in certain example embodiments, by $(Nb+Zr)_xO_y$, where the ratio y/x (i.e., the ratio of oxygen to Nb+Zr) is from 0.00001 to 1.0, even more preferably from 0.03 to 0.20, and still more preferably from 0.05 to 0.15. These oxygen/metal content ranges, for purposes of example only and without limitation unless expressly claimed, have been found to lead to significantly improved $\Delta E^*$ value(s) combined with good durability.

In certain example non-limiting embodiments, the oxygen ($O_2$) gas flow when sputtering a NbZr target(s) may be from about 0.5 to 6 sccm/kW, more preferably from about 1 to 4 sccm/kW, and most preferably from about 2 to 3 sccm/kW (where kW is a unit of power used in sputtering). These oxygen flows, for purposes of example only and without limitation unless expressly claimed, have been found to lead to significantly improved $\Delta E^*$ value(s).

For example, the use of $NbZrO_x$ in an IR reflecting layer(s) allows the resulting coated article(s) to achieve at least one of: (a) improved corrosion resistance to alkaline solutions such as NaOH (compared to layer stacks of glass/$Si_3N_4$/Nb/$Si_3N_4$ and glass/$Si_3N_4$/$NbN_x$/$Si_3N_4$); (b) good thermal performance comparable to that of Nb and $NbN_x$; (c) good mechanical performance such as scratch resistance; and/or (d) good color stability upon heat treatment (e.g., lower $\Delta E^*$ value(s) than coated articles with layer stacks of glass/$Si_3N_4$/NiCr/$Si_3N_4$).

Due to its spectral selectivity, niobium zirconium oxide ($NbZrO_x$) provides thermal performance (e.g., IR blocking) similar to or better than NiCr and $NbN_x$, but are surprisingly more durable than both NiCr and $NbN_x$. Moreover, it has surprisingly been found that in certain example instances the use of $NbZrO_x$ in/as an IR reflecting layer(s) allows the solar control coating to have significantly improved color stability upon HT (e.g., a lower $\Delta E^*$ value with a given HT time) than the aforesaid conventional coating where metallic NiCr is used as the IR reflecting layer.

A coated article according to an example embodiment of this invention utilizes such a $NbZrO_x$ IR reflecting layer(s) sandwiched between at least a pair of dielectric layers of a material(s) such as silicon nitride or some other suitable dielectric material(s). In certain example embodiments of this invention, the $NbZrO_x$ layer is not in contact with any metallic IR reflecting layer (e.g., is not in contact with any Ag or Au layer).

In certain example embodiments of this invention, heat treated (HT) coated articles including a NbZr and/or $NbZrO_x$ inclusive IR reflecting layer(s) have a glass side reflective $\Delta E^*$ value due to heat treatment of no greater than 4.0, more preferably no greater than 3.0, more preferably no greater than 2.5, still more preferably no greater than 2.0, even more preferably no greater than 1.5, and sometimes even no greater than 1.0. For purposes of example, the heat treatment (HT) may be for at least about 5 minutes at a temperature(s) of at least about 580 degrees C. (e.g., ten minutes at about 625 degrees C.).

In certain example embodiments of this invention, the Zr:Nb ratio (atomic %) in the NbZr and/or $NbZrO_x$ inclusive IR reflecting layer(s) may be from about 0.001 to 1.0, more preferably from about 0.001 to 0.60, and even more preferably from about 0.004 to 0.50, and most preferably from about 0.05 to 0.2 (e.g., 0.11). For purposes of example only, if a 90/10 Nb/Zr target was used, the Zr:Nb ratio would be about 0.11. In certain example embodiments, the IR reflecting layer comprising NbZr and/or $NbZrO_x$ may include from about 0.1 to 60% Zr, more preferably from about 0.1 to 40% Zr, even more preferably from 0.1 to 20%, still more preferably from 0.1 to 15%, more preferably from about 0.4 to 15% Zr, and most preferably from 3 to 12% Zr (atomic %). Nitride gas may also be used so as to at least partially nitride the $NbZrO_x$ in certain alternative embodiments of this invention.

Optionally, a protective overcoat of a material such as zirconium oxide may also be provided in certain example embodiments.

In certain example embodiments of this invention, there is provided a coated article including a layer system supported by a substrate, the layer system comprising: a first dielectric layer; a layer comprising an oxide of niobium zirconium ($NbZrO_x$) provided on the substrate over at least the first dielectric layer; and a second dielectric layer provided on the substrate over at least the layer comprising the oxide of niobium zirconium.

In certain other example embodiments of this invention, there is provided a method of making a coated article, the method comprising: sputtering a target comprising niobium and zirconium in an atmosphere including oxygen in order to form a layer comprising an oxide of niobium zirconium supported by a substrate; and sputtering a dielectric layer over at least the layer comprising the oxide of niobium zirconium.

IN THE DRAWINGS

DETAILED DESCRIPTION OF CERTAIN EXAMPLE EMBODIMENTS OF THE INVENTION

Certain embodiments of this invention provide coated articles that may be used in windows such as monolithic windows (e.g., vehicle, residential, and/or architectural windows), IG window units, and/or other suitable applications. Certain example embodiments of this invention provide a layer system that is characterized by at least one of: (a) good corrosion resistance to acids, and alkaline solutions such as NaOH; (b) good thermal performance such as blocking of significant amounts of IR and/or UV radiation; (c) good mechanical performance such as scratch resistance; and/or (d) good color stability upon heat treatment (i.e., low $\Delta E^*$ value(s)). With respect to color stability upon heat treatment (HT), this means a low value of $\Delta E^*$; where $\Delta$ is indicative of a*, b* and L* change in view of HT such as thermal tempering, heat bending, or thermal heat strengthening, monolithically and/or in the context of dual pane environments such as IG units or laminates.

Figure 1:
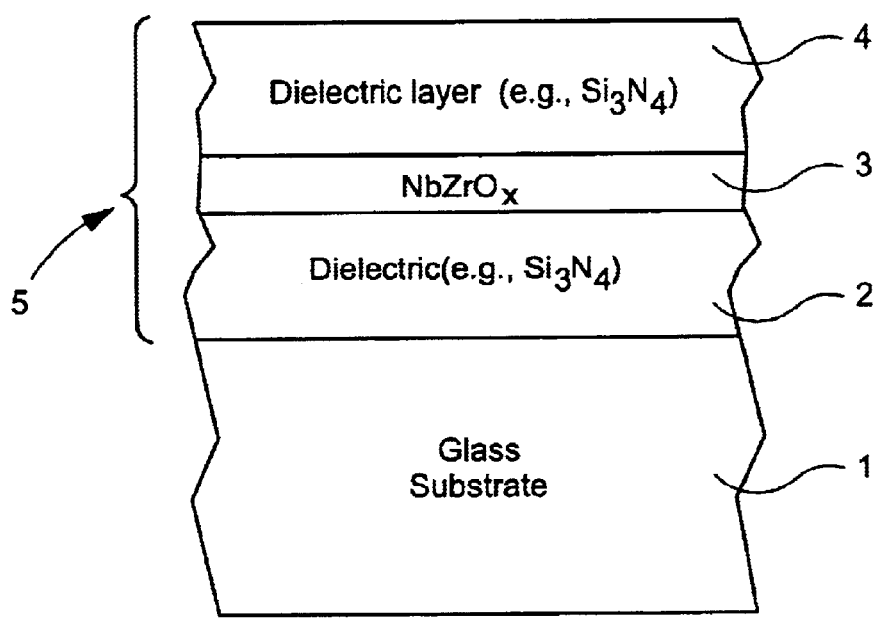
FIG. 1 is a partial cross sectional view of an embodiment of a monolithic coated article (heat treated or not heat treated) according to an example embodiment of this invention.

FIG. 1 is a side cross sectional view of a coated article according to an example embodiment of this invention. The coated article includes at least substrate 1 (e.g., clear, green, bronze, grey, blue, or blue-green glass substrate from about 1.0 to 12.0 mm thick), first optional dielectric layer 2 (e.g., of or including silicon nitride (e.g., $Si_3N_4$), tin oxide, or some other suitable dielectric such as a metal oxide and/or nitride), infrared (IR) reflecting layer 3 of or including niobium zirconium (NbZr) and/or an oxide of niobium zirconium ($NbZrO_x$), and second dielectric layer 4 (e.g., of or including silicon nitride (e.g., $Si_3N_4$), tin oxide, or some other suitable dielectric such as a metal oxide and/or nitride). In certain alternative embodiments, the bottom dielectric layer 2 may be omitted so that the IR reflecting layer 3 is located in contact with the glass substrate. Also, it is possible to nitride the $NbZrO_x$ IR reflecting layer to some extent in certain alternative embodiments of this invention.

Optionally, a protective overcoat of or including a material such as zirconium oxide (not shown) may be provided over layers 2–4 in certain example embodiments of this invention. Example protective overcoats comprising silicon nitride, zirconium oxide and/or chromium oxide which may be optionally used in certain example embodiments of this invention are described in U.S. patent application Ser. No. 10/406,003, filed Apr. 3, 2003, the disclosure of which is hereby incorporated herein by reference.

In certain example embodiments of this invention, coating 5 optionally may not include any metallic IR blocking or reflecting layer of Ag or Au. In such embodiments, NbZr and/or $NbZrO_x$ inclusive IR reflecting layer(s) 3 may be the only IR reflecting layer in coating 5, although many such layers may be provided in certain instances. In certain example embodiments of this invention, NbZr and/or $NbZrO_x$ IR reflecting layer 3 reflects at least some IR radiation. In certain example embodiments, it is possible for the NbZr and/or $NbZrO_x$ layer 3 to include other materials such as dopants.

Overall coating 5 includes at least layers 2–4. It is noted that the terms "oxide" and "nitride" as used herein include various stoichiometries. For example, the term silicon nitride includes stoichiometric $Si_3N_4$, as well as non-stoichiometric silicon nitride. Silicon nitride may of course be doped with Al, Zr and/or any other suitable metal. Similarly, a zirconium oxide overcoat may be doped with Si, or other materials. Layers 2–4 may be deposited on substrate 1 via magnetron sputtering, any other type of sputtering, or via any other suitable technique in different embodiments of this invention.

Surprisingly, it has been found that the use of Zr and Nb in IR reflecting layer 3 allows the resulting coated article to realize excellent chemical and mechanical durability, and also good thermal performance. For example, the use of NbZr and/or $NbZrO_x$ in IR reflecting layer(s) 3 allows the resulting coated article(s) to achieve: (a) improved corrosion resistance to alkaline solutions such as NaOH (compared to layer stacks of glass/$Si_3N_4$/Nb/$Si_3N_4$ and glass/$Si_3N_4$/$NbN_x$/$Si_3N_4$); (b) excellent thermal performance comparable to that of Nb and $NbN_x$; (c) good mechanical performance such as scratch resistance; and/or (d) good color stability upon heat treatment (e.g., lower $\Delta E^*$ value(s) than coated articles with layer stacks of glass/$Si_3N_4$/NiCr/$Si_3N_4$). It has surprisingly been found that in certain example instances, the use of NbZr instead of Nb allows for a lower $\Delta E^*$ value(s).

Furthermore, in certain example $NbZrO_x$ embodiments, it has unexpectedly been found that oxiding (e.g., partial oxiding) is particularly beneficial with respect to lowering $\Delta E^*$ value(s). For example, in certain example embodiments, oxygen ($O_2$) gas flows when sputtering a NbZr target(s) may be from about 0.5 to 6 sccm/kW, more preferably from about 1 to 4 sccm/kW, and most preferably from about 2 to 3 sccm/kW (where kW is a unit of power used in sputtering). These oxygen flows, have been found to lead to significantly improved $\Delta E^*$ value(s). As will be shown below, $\Delta E^*$ value(s) can be lowered even further due to oxiding the NbZr inclusive layer to form a layer comprising $NbZrO_x$, compared to non-oxided layers of NbZr and $NbZrN_x$.

In certain example embodiments, the Zr:Nb ratio (atomic %) layer 3 may be from about 0.001 to 1.0, more preferably from about 0.001 to 0.60, and even more preferably from about 0.004 to 0.50, and still more preferably from 0.05 to 0.2 (e.g., 0.11). In certain example embodiments, with respect to metal content, the IR reflecting layer may include from about 0.1 to 60% Zr, more preferably from about 0.1 to 40% Zr, even more preferably from 0.1 to 20%, still more preferably from 0.1 to 15%, more preferably from about 0.4 to 15% Zr, and most preferably from 3 to 12% Zr (atomic %). Surprising durability improvement has been observed even for very low Zr contents determined to be less than 0.44 atomic % (Zr/Nb ratio of 0.00438), while at the same time thermal performance is comparable to the use of Nb.

In embodiments where the IR reflecting layer 3 is of or includes $NbZrO_x$ (i.e., an oxide of NbZr), the atomic ratio in the layer of oxygen to the total combination of Nb and Zr may be represented, in certain example embodiments, by $(Nb+Zr)_xO_y$, where the ratio y/x (i.e., the ratio of oxygen to Nb+Zr) is from 0.00001 to 1.0, even more preferably from 0.03 to 0.20, and still more preferably from 0.05 to 0.15. This ratio is applicable before and/or after heat treatment. Thus, it can be seen that in certain example embodiments of this invention, the NbZr inclusive layer is partially oxided, although such oxidation is certainly material in that it results in significant advantages over non-oxided versions.

While FIG. 1 illustrates coating 5 in a manner where NbZr and/or $NbZrO_x$ layer 3 is in direct contact with dielectric layers 2 and 4, and wherein layer 3 is the only IR reflecting layer in the coating, the instant invention is not so limited. Other layer(s) may be provided between layers 2 and 3 (and/or between layers 3 and 4) in certain other embodiments of this invention. Moreover, other layer(s) (not shown) may be provided between substrate 1 and layer 2 in certain embodiments of this invention; and/or other layer(s) (not shown) may be provided on substrate 1 over layer 4 in certain embodiments of this invention. Thus, while the coating 5 or layers thereof is/are "on" or "supported by" substrate 1 (directly or indirectly), other layer(s) may be provided therebetween. Thus, for example, the layer system 5 and layers thereof shown in FIG. 1 are considered "on" the substrate 1 even when other layer(s) (not shown) are provided therebetween (i.e., the terms "on" and "supported by" as used herein are not limited to directly contacting). Also, more than one NbZr and/or $NbZrO_x$ IR reflecting layer may be provided in alternative embodiments of this invention.

In certain example embodiments of this invention, dielectric anti-reflection layer 2 may have an index of refraction "n" of from 1.7 to 2.7, more preferably from 1.9 to 2.5 in certain embodiments, while layer 4 may have an index of refraction "n" of from about 1.4 to 2.5, more preferably from 1.9 to 2.3. Meanwhile, layer 3 when comprising an oxide of NbZr may have an index "n" of from about 2.0 to 3.2, more preferably from 2.2 to 3.0, and most preferably from 2.4 to 2.9; and may have an extinction coefficient "k" of from 2.5 to 4.5, more preferably from 3.0 to 4.0, and most preferably from 3.3 to 3.8. In embodiments of this invention where layers 2 and/or 4 comprise silicon nitride (e.g., $Si_3N_4$), sputtering targets including Si employed to form these layers may or may not be admixed with up to 1–40% by weight aluminum, zirconium and/or stainless steel (e.g. SS#316), with about this amount then appearing in the layers so formed. Even with this amount(s) of aluminum and/or stainless steel, such layers 2 and 4 are still considered dielectric layers herein.

While FIG. 1 illustrates a coated article according to an embodiment of this invention in monolithic form, coated articles according to other embodiments of this invention may comprise IG (insulating glass) window units. In IG embodiments, coating 5 from FIG. 1 may be provided on the inner wall of the outer substrate of the IG unit, and/or on the inner wall of the inner substrate, or in any other suitable location in other embodiments of this invention.

Turning back to FIG. 1, various thicknesses may be used consistent with this invention. According to certain non-limiting example embodiments of this invention, example thicknesses and materials for the respective layers 2–4 on the glass substrate 1 are as follows:

TABLE 1

(Example non-limiting thicknesses)

| Layer | Example Range (Å) | Preferred (Å) | Best (Å) |
|---|---|---|---|
| silicon nitride (layer 2): | 0–1,500Å | 20–1300Å | 50–1200 Å |
| NbZr or NbZrO$_x$ (layer 3): | 30–700Å | 100–500Å | 120–350 Å |
| silicon nitride (layer 4): | 10–900Å | 100–800Å | 150–500 Å |

In certain exemplary embodiments, the color stability with HT may result in substantial matchability between heat-treated and non-heat treated versions of the coating or layer system. In other words, in monolithic and/or IG applications, in certain embodiments of this invention two glass substrates having the same coating system thereon (one HT after deposition and the other not HT) appear to the naked human eye to look substantially the same.

The value(s) $\Delta E^*$ is important in determining whether or not there is matchability, or substantial color matchability upon HT, in the context of certain embodiments of this invention (i.e., the term $\Delta E^*$ is important in determining color stability upon HT). Color herein is described by reference to the conventional a*, b* values. For example, the term $\Delta a^*$ is indicative of how much color value a* changes due to HT. The term $\Delta E^*$ (and $\Delta E$) is well understood in the art. The definition of the term $\Delta E^*$ may be found, for example, in WO 02/090281 and/or U.S. Pat. No. 6,475,626, the disclosures of which are hereby incorporated herein by reference. In particular, $\Delta E^*$ corresponds to the CIE LAB Scale L*, a*, b*, and is represented by:

$$\Delta E^* = \{(\Delta L^*)^2 + (\Delta a^*)^2 + (\Delta b^*)^2\}^{1/2} \quad (1)$$

where:

$$\Delta L^* = L^*_1 - L^*_o \quad (2)$$

$$\Delta a^* = a^*_1 - a^*_o \quad (3)$$

$$\Delta b^* = b^*_1 - b^*_o \quad (4)$$

where the subscript "o" represents the coating (or coated article) before heat treatment and the subscript "1" represents the coating (or coated article) after heat treatment; and the numbers employed (e.g., a*, b*, L*) are those calculated by the aforesaid (CIE LAB 1976) L*, a*, b* coordinate technique. In a similar manner, $\Delta E$ may be calculated using equation (1) by replacing a*, b*, L* with Hunter Lab values $a_h$, $b_h$, $L_h$. Also within the scope of this invention and the quantification of $\Delta E^*$ are the equivalent numbers if converted to those calculated by any other technique employing the same concept of $\Delta E^*$ as defined above.

Before heat treatment (HT) such as thermal tempering, in certain example embodiments of this invention coated articles have color characteristics as follows in Table 2 (monolithic and/or IG unit). It is noted that subscript "G" stands for glass side reflective color, subscript "T" stands for transmissive color, and subscript "F" stands for film side color. As is known in the art, glass side (G) means reflective color when viewed from the glass side (as opposed to the layer/film side) of the coated article. Film side (F) means reflective color when viewed from the side of the coated article on which the coating 5 is provided. Table 3 set forth below illustrates certain characteristics of coated articles according to certain example embodiments of this invention after HT such as thermal tempering (monolithic and/or IG units)—the characteristics below in Table 2 (non-HT) are also applicable to HT coated articles herein, except for the additions set forth in Table 3.

TABLE 2

Color/Optical Characteristics (non-HT)

| | General | Preferred | Most Preferred |
|---|---|---|---|
| $T_{vis}$ (TY): | 6–80% | 8–50% | 10–30% |
| $L^*_T$ | 29–92 | 34–76 | 37–62 |
| $a^*_T$ | −16 to +10 | −6 to +5 | −3 to +3 |
| $b^*_T$ | −20 to +20 | −15 to +10 | −10 to +10 |
| $R_G Y$(glass side): | 6–50% | 10–40% | 10–35% |
| $L^*_G$ | 29–76 | 37–70 | 37–65 |
| $a^*_G$ | −20 to +10 | −12 to +6 | −5 to +3 |
| $b^*_G$ | −30 to +20 | −25 to +10 | −20 to +10 |
| $R_F Y$(film side): | 6–50% | 6–40% | 6–35% |
| $L^*_F$ | 29–76 | 29–70 | 29–68 |
| $a^*_F$ | −20 to +20 | −10 to +10 | −5 to +5 |
| $b^*_F$ | −40 to +40 | −30 to +30 | −20 to +30 |
| $E_h$ (emissivity): | <=0.5 | <=0.4 | <=0.38 |
| $R_s$ (Ω/sq): | <250 | <100 | <60 |

TABLE 3

Color/Optical Characteristics (after HT; in addition to Table 2)

| | General | Preferred | Most Preferred |
|---|---|---|---|
| $\Delta E^*_G$ | <=4.0 | <=2.5 | <=1.5 |
| $\Delta E^*_T$ | <=5.0 | <=3.0 | <=2.5 |
| $\Delta a^*_G$ | <=2.5 | <=1.0 | <=0.8 |
| $\Delta b^*_G$ | <=4.0 | <=2.0 | <=0.6 |
| $\Delta L^*_G$ | <=4.0 | <=2.5 | <=1.5 |

As explained herein, oxiding the NbZr inclusive IR reflecting layer to form a layer comprising NbZrO$_x$ is advantageous in that it unexpectedly allows an even lower $\Delta E^*$ value to be achieved. In certain NbZrO$_x$ embodiments, the coated article may have a glass side reflective $\Delta E^*$ value due to heat treatment of no greater than 4.0, more preferably no greater than 3.0, more preferably no greater than 2.5, still more preferably no greater than 2.0, even more preferably no greater than 1.5, and sometimes even no greater than 1.0.

For purposes of example only, a plurality of examples representing different example embodiments of this invention are set forth below.

EXAMPLES

Examples 1–2 and 4 are non-oxided examples of this invention (i.e., NbZr IR reflecting layers), whereas Examples 3 and 5–7 are examples where the IR reflecting layer is oxided so as to include NbZrO$_x$.

Examples 1–2

Examples 1–2 were monolithic coated articles (each ultimately annealed and heat treated, although not all embodiments herein need be HT), with the layer stack as shown in FIG. 1. The Si$_3$N$_4$ layers 2 and 4 in each example were deposited by sputtering a silicon target (doped with about 10% Al) in an atmosphere including nitrogen and argon gases. The NbZr IR reflecting layer 3 in each example was deposited by sputtering a target of about 90% Nb and about 10% Zr in an atmosphere including argon gas. For Example 1, the following sputtering process parameters were used in depositing the coating. Line speed is in inches per minute (IPM), and gas (Ar, O and N) flows were in units of sccm:

TABLE 4

Example 1 Coating Process Parameters

| Layer | Power | Voltage | Line Speed | # Passes | Ar flow | N flow | O flow |
|---|---|---|---|---|---|---|---|
| SiN layer 2: | 2.5 kW | 485 V | 37.4 | 6 | 40 | 55 | 0 |
| NbZr layer 3: | 1.0 kW | 368 V | 32 | 1 | 30 | 0 | 0 |
| SiN layer 4: | 2.5 kW | 486 V | 47 | 2 | 40 | 55 | 0 |

For Example 2, the following sputtering process parameters were used in depositing the coating. Again, line speed is in inches per minute (IPM), and gas flows were in units of sccm:

TABLE 5

Example 2 Coating Process Parameters

| Layer | Power | Voltage | Line Speed | # Passes | Ar flow | N flow | O flow |
|---|---|---|---|---|---|---|---|
| SiN layer 2: | 2.5 kW | 485 V | 42.8 | 2 | 40 | 55 | 0 |
| NbZr layer 3: | 1.0 kW | 369 V | 31 | 1 | 30 | 0 | 0 |
| SiN layer 4: | 2.5 kW | 484 V | 32.9 | 2 | 40 | 55 | 0 |

It is noted that each of these Examples could easily have been transformed into an $NbZrN_x$ embodiment by merely turning on an appropriate amount of nitrogen gas flow during the sputtering deposition of the IR reflecting layer 3. Moreover, it is possible that the NbZr layer 3 can be nitrided as a result of nitrogen diffusion during heat treatment, even if no nitrogen is intentionally added during sputtering. NbZr deposited over silicon nitride, and/or NbZr overcoated with silicon nitride, may have some nitrogen therein due to diffusion even before heat treatment.

After being sputtered, Examples 1–2 had the following characteristics (annealed and non-HT, monolithic) (Ill. C, 2 degree observer):

TABLE 6

Characteristics (non-HT)

| Parameter | Ex. 1 | Ex. 2 |
|---|---|---|
| $T_{vis}$ (TY)(transmission): | 19.4% | 20.9% |
| $a^*_T$ | -1.5 | -1.4 |
| $b^*_T$ | 3.9 | -4.9 |
| $L^*_T$ | 51.2 | 52.9 |
| $R_GY$(glass side refl. %): | 19.0% | 30.8% |
| $a^*_G$: | -0.7 | -2.9 |
| $b^*_G$: | -19.2 | -0.9 |
| $L^*_G$: | 50.7 | 62.3 |
| $R_FY$ (film side refl. %): | 38.1% | 22.3% |
| $a^*_F$: | 0.2 | 0.4 |
| $b^*_F$: | 14.5 | 23.4 |
| $L^*_F$: | 68.1 | 54.4 |
| $T_{sol}$ (TS): | 15% | 15% |
| Shading Coefficient (SC): | 0.366 | 0.335 |
| SHGC: | 0.315 | 0.288 |
| $T_{uv}$ (UV transmission): | 11% | 16.5% |
| Emissivity (hemispherical): | 0.36 | 0.34 |
| $R_s$ (sheet resistance; ohms/sq.): | 49.7 | 45.1 |

Each of Examples 1–2 had a layer stack as follows, set forth in Table 7. The thicknesses and stoichiometries listed below in Table 7 for the Examples 1–2 are approximations and are not exact. The glass substrates were clear and about 6 mm thick in each Example.

TABLE 7

Coatings in Examples

| | |
|---|---|
| Example 1: | Glass/$Si_3N_4$(850 Å)/NbZr(190 Å)/$Si_3N_4$(210 Å) |
| Example 2: | Glass/$Si_3N_4$(190 Å)/NbZr(200 Å)/$Si_3N_4$(300 Å) |

Both Examples were then evaluated and tested for durability, showing excellent performance in standard mechanical and chemical tests as coated and after HT. For example, the Teledyne scratch test with a 500 g load did not produce noticeable scratches on either sample. A taber abrasion test after 500 revolutions was also passed. A one hour NaOH boil test was also passed although some changes in color were observed. When a zirconium oxide overcoat was provided, the NaOH boil test was passed in an improved fashion.

After being sputter coated, Examples 1–2 (as in Tables 4–7 above with no ZrO overcoat) were heat treated for 10 minutes at about 625 degrees C. Table 8 below sets forth certain color stability characteristics of Examples 1–2 upon/after such heat treatment (HT).

TABLE 8

Glass Side Reflective Color Stability Upon HT

| Parameter | Example 1 | Example 2 |
|---|---|---|
| $\Delta E^*_G$: | 1.7 | 2.5 |

As can be seen from Table 8, Examples 1–2 were characterized by satisfactory glass side reflective $\Delta E^*$ values (the lower the better). These low values illustrate how little the glass side reflective optical characteristics of the coating change upon HT. This is indicative of good color stability upon heat treatment. Additionally, it has been found in other NbZr examples similar to Examples 1–2 but having higher Zr content of about 10% in layer 3 that glass side reflective $\Delta E^*$ is from about 1.9 to 2.0.

For purposes of comparison, consider the following layer stack: glass/$Si_3N_4$/NiCr/$Si_3N_4$, which has a glass side reflective ΔE* value of above 5.0 after heat treatment (HT) at 625 degrees C. for ten minutes. Examples 1–2 above clearly illustrate the comparative advantage of using niobium zirconium, as opposed to NiCr, for the IR reflecting layer (a much lower glass side reflective ΔE* value is achievable).

3 in Example 7 was deposited by sputtering a target of about 85% Nb and about 15% Zr. For Example 3, the following sputtering process parameters were used in depositing the coating. Line speed is in inches per minute (IPM), and gas (Ar, O and N) flows were in units of sccm:

TABLE 9

Example 3 Coating Process Parameters

| Layer | Power | Voltage | Line Speed | # Passes | Ar flow | N flow | O flow |
|---|---|---|---|---|---|---|---|
| SiN layer 2: | 1.0 kW | 434 V | 46.3 | 5 | 40 | 40 | 0 |
| NbZr layer 3: | 1.0 kW | 374 V | 58 | 2 | 30 | 0 | 3 |
| SiN layer 4: | 1.0 kW | 437 V | 46.2 | 7 | 40 | 55 | 0 |

Examples 3–7

Examples 3–7 illustrate the unexpected finding that oxidizing the NbZr IR reflecting layer 3 even further lowers the ΔE* value(s) according to certain embodiments of this invention. Although the coatings of Examples 1–2 with NbZr layers 3 have good color stability upon HT, still lower ΔE* value(s) would represent a significant commercial advantage. The human eye is able to notice slight differences in appearance between two samples having a ΔE* value of 2.0 (the first sample being non-HT and the second sample having been subjected to HT). However, the human eye is typically not able to notice slight differences in appearance between two samples having a ΔE* value of less than about 1.5. For this reason, being able to achieve a human eye is able to notice slight differences in appearance between two samples having a ΔE* value of 1.5 or less would represent a significant advantage in the art. It could be possible to achieve such low ΔE* value(s) using an IR reflecting layer of NbN or NbZrN; however, nitrides sometimes have visibly worse thermal and/or optical performance than metallic materials.

Surprisingly, as will be shown in Examples 3–7, it has been found that partially oxidizing NbZr layers (deposited reactively with low oxygen gas flows, the main gas being argon) allow for significantly low ΔE* values to be achieved without any significant negative impact on spectral selectivity (e.g., thermal performance). It has also been found that allows with higher Zr content become stable at lower oxygen flows, and that alloys with higher oxygen content are generally more stable in transmission—depending upon the film design. About 10% Zr has been found to work very well in certain example embodiments of this invention. Moreover, it has been found that the best results can be achieved using oxygen ($O_2$) gas flows when sputtering a NbZr target(s) of from about 0.5 to 6 sccm/kW, more preferably from about 1 to 4 sccm/kW, and most preferably from about 2 to 3 sccm/kW (where kW is a unit of power used in sputtering)—see Examples below.

The examples were monolithic coated articles (each ultimately annealed and heat treated, although not all embodiments herein need be HT), with the layer stack as shown in FIG. 1. The $Si_3N_4$ layers 2 and 4 in all below Examples 3–7 were deposited by sputtering a silicon target (doped with about 10% Al) in an atmosphere including nitrogen and argon gases. The $NbZrO_x$ IR reflecting layer 3 in Examples 3–6 was deposited by sputtering a target of about 90% Nb and about 10% Zr, whereas the $NbZrO_x$ IR reflecting layer Thus, it can be seen that the IR reflecting layer 3 in Example 3 was oxided. After being sputtered, Example 3 had the following characteristics (annealed and non-HT, monolithic) (Ill. C, 2 degree observer):

TABLE 10

Example 3 Characteristics (non-HT)

| Parameter | Ex. 3 |
|---|---|
| $T_{vis}$ (TY)(transmission): | 19.5% |
| $a*_T$ | −1.1 |
| $b*_T$ | −4.3 |
| $L*_T$ | 52.9 |
| $R_GY$(glass side refl. %): | 30.4% |
| $a*_G$: | −2.7 |
| $b*_G$: | −0.9 |
| $L*_G$: | 62 |
| $R_FY$ (film side refl. %): | 26.5% |
| $a*_F$: | −0.4 |
| $b*_F$: | 18.2 |
| $L*_F$: | 58.5 |
| Emissivity (hemispherical): | 0.34 |
| $R_s$ (sheet resistance; ohms/sq.): | 48.1 |

Example 3 had a layer stack as follows, set forth in Table 7. The thicknesses and stoichiometries listed below in Table 11. The glass substrate was clear and about 6 mm thick.

TABLE 8

Coating in Example 3

| Example 3: | Glass/$Si_3N_4$(230 Å)/NbZrO(175 Å)/$Si_3N_4$(320 Å) |
|---|---|

Example 3 was then evaluated and tested for durability, showing excellent performance in standard mechanical and chemical tests as coated and after HT. For example, the Teledyne scratch test with a 500 gm load did not produce noticeable scratches on either sample. A taber abrasion test after 500 revolutions was also passed. A one hour NaOH boil test was also passed although some changes in color were observed.

After being sputter coated, Example 3 was heat treated for about 10 minutes at about 625 degrees C. Table 12 below sets forth certain color stability characteristics of Examples 3–7. Table 12 includes the amount of oxygen used in sputtering the IR reflecting layer 3 in each of Examples 3–7, and also includes the glass side reflective ΔE* values due to HT (the IR reflecting layers 3 for each of Examples 3–7 was deposited using 30 sccm Ar gas flow and 1 kW of power).

TABLE 12

Glass Side Reflective Color Stability Upon HT

| | Oxygen Flow (sccm) | $\Delta E^*_G$ |
|---|---|---|
| Ex. 3 | 3 | 0.9 |
| Ex. 4 | 0 | 2.6 |
| Ex. 5 | 2 | 1.2 |
| Ex. 6 | 4 | 2.6 |
| Ex. 7 | 3 | 0.8 |

As can be seen from Table 8, Examples 1–2 were characterized by satisfactory glass side reflective $\Delta E^*$ values (the lower the better). These low values illustrate how little the glass side reflective optical characteristics of the coating change upon HT. This is indicative of good color stability upon heat treatment. Additionally, it has been found in other NbZr examples similar to Examples 1–2 but having higher Zr content of about 10% in layer 3 that glass side reflective $\Delta E^*$ is from about 1.9 to 2.0.

Moreover, Table 12 illustrates that even lower $\Delta E^*$ (glass side) values can be achieved by oxidizing the NbZr inclusive IR reflecting layer 3 so as to form a layer comprising $NbZrO_x$. This is shown by the fact that the $NbZrO_x$ examples (Examples 3 and 5–7) were characterized by $\Delta E^*$ (glass side) values equal to or lower than non-oxided Example 4 as shown in Table 12. Furthermore, Table 12 illustrates that oxygen gas flows in the range of from about 2 to 3 sccm/kW unexpectedly allowed for the best $\Delta E^*$ (glass side) values (i.e., the lowest) to be achieved.

Examples 8–18

Examples 8–18 also illustrate the unexpected finding that oxiding the NbZr IR reflecting layer 3 even further lowers the $\Delta E^*$ value(s) according to certain embodiments of this invention. The layer stack for each of Examples 8–18 was glass/$Si_3N_4$/NbZrO/$Si_3N_4$. In Examples 8–10, 14–16 and 18 the silicon nitride overcoat was about 280 to 330 angstroms thick; and in Examples 11–13 and 17 the silicon nitride (doped with Al in all cases in these examples) undercoat was about 800 angstroms thick and the silicon nitride overcoat was about 200 to 300 angstroms thick. The only other changes between these examples were variations in the oxygen flow used during sputtering ($O_2$ gas flow in units of sccm) of the NbZrO layer 3, and variation in the Zr content of the ZrNb alloy target, and the results relating thereto as set forth in the table below. Clear glass substrates were used, and the $\Delta E^*$ data below was for monolithic heat treated articles. As shown in the table below, it has surprisingly been found that a ratio of oxygen to metal (e.g., Zr and Nb) atoms in the NbZrO layer 3 (i.e., O/(Zr+Nb)) of from 0.05 to 0.15 has been unexpectedly found to be particularly beneficial. Examples 8–13 used sputtering targets for layer 3 having a 5% Zr content, whereas Examples 14–17 used sputtering targets having a 10% Zr content, and Example 18 used a target with a 15% Zr content. The example non-limiting heat treatment used in determining the $\Delta E^*$ data for Examples 8–18 was for about ten minutes at about 625 degrees C. (although other types of HT may of coursed be used—the $\Delta E^*$ values will be lower for shorter periods of HT and/or lower temperatures during HT).

TABLE 13

Examples 8–18

| Ex. | $O_2$ Flow | $\Delta E^*_g$ | Atomic Ratio: O/(Nb + Zr) |
|---|---|---|---|
| 8 | 1 sccm | 2.4 | 0.05 to 0.1 |
| 9 | 2 sccm | 2.05 | 0.07 to 0.12 |
| 10 | 3 sccm | 1.7 | 0.09 to 0.15 |
| 11 | 1 sccm | n/a | 0.05 to 0.1 |
| 12 | 2 sccm | 1.2 | 0.07 to 0.12 |
| 13 | 3 sccm | 1.2 | 0.09 to 0.15 |
| 14 | 1 sccm | 1.25 | 0.05 to 0.1 |
| 15 | 2 sccm | 1.2 | 0.07 to 0.12 |
| 16 | 3 sccm | 0.8 | 0.09 to 0.15 |
| 17 | 2 sccm | 1.1 | 0.07 to 0.12 |
| 18 | 3 sccm | 0.75 | 0.09 to 0.15 |

Figure 2:
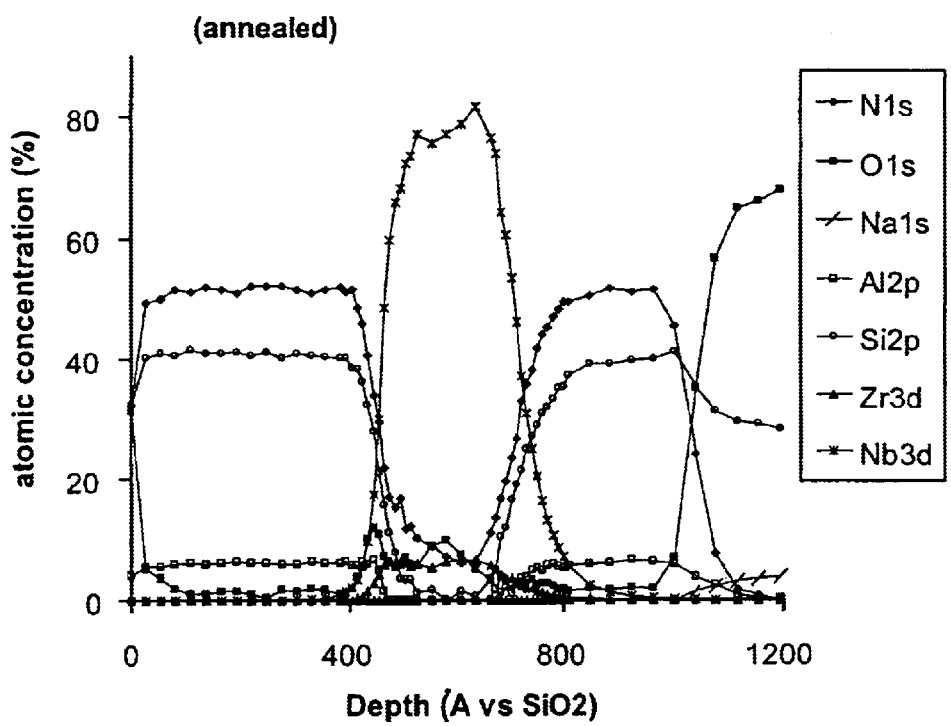
FIG. 2 is an XPS graph of a coated article (pre-HT) according to an example of this invention.
Figure 3:
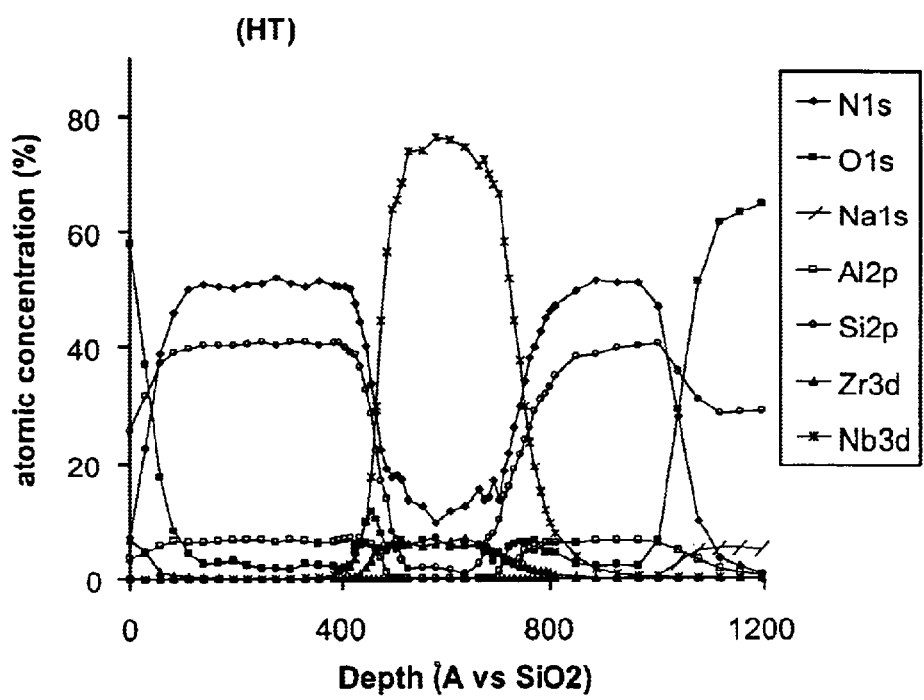
FIG. 3 is an XPS graph of the coated article of FIG. 2, post-HT.

FIGS. 2–3 are XPS graphs of a coated article similar to Example 16, where the oxygen gas flow during deposition of the NbZrO layer 3 was 3 sccm. FIG. 2 is before heat treatment, whereas FIG. 3 is after heat treatment for about ten minutes at about 625 degrees C. The spike in Nb content in the central area of each of the FIG. 2 and FIG. 3 graphs illustrates the position of the NbZrO layer 3, whereas the pair of nitrogen spikes on either side thereof indicates silicon nitride layers 2 and 4. The increased oxygen content on the right sides of FIGS. 2 and 3 is indicative of the glass substrate (i.e., the outer surface of the coated article is at the left of these figures whereas the glass substrate is at the right of these figures). It can be seen from FIGS. 2–3 that the NbZrO layer 3 includes much more Nb than Zr, and also that the layer 3 is lightly nitrided.

Still referring to FIGS. 2–3, it can be seen that for this example, the ratio of oxygen to metals in layer 3 (i.e., $(Nb+Zr)_xO_y$, where the ratio y/x is of oxygen to Nb+Zr) is from 0.09 to 0.15 in at least one part of the layer 3. Moreover, it can be seen that NbZrO layer 3 is oxidation graded. In particular, the oxygen content in NbZrO layer 3 is higher near the interface with, for example, the overlying silicon nitride layer 4 compared to certain other portions of layer 3. This oxygen gradient has been found to be particularly beneficial at the interface with the top silicon nitride layer 4 since the higher oxygen content at this location tends to reduce the amount of nitrogen which diffuses into layer 3, before and/or after HT. Thus, this oxygen gradient (i.e., higher oxygen content in layer 3 proximate the interface with the top silicon nitride layer) has unexpectedly been found to improve color stability of the coated article, upon heat treatment for example.

Referring to FIGS. 2–3, nitrogen tends to diffuse into the NbZrO layer 3 during sputtering thereof and/or thereafter, so as to create a gradient layer 3 where the nitrogen content decreases towards the center of the layer 3. It has been found that the layer 3 can tolerate nitrogen more easily with smaller Zr content.

Certain terms are prevalently used in the glass coating art, particularly when defining the properties and solar management characteristics of coated glass. Such terms are used herein in accordance with their well known meaning. For example, as used herein:

Intensity of reflected visible wavelength light, i.e. "reflectance" is defined by its percentage and is reported as $R_xY$ (i.e. the Y value cited below in ASTM E-308-85), wherein "X" is either "G" for glass side or "F" for film side. "Glass side" (e.g. "G") means, as viewed from the side of the glass substrate opposite that on which the coating resides, while "film side" (i.e. "F") means, as viewed from the side of the glass substrate on which the coating resides.

Color characteristics are measured and reported herein using the CIE LAB a*, b* coordinates and scale (i.e. the CIE a*b* diagram, Ill. CIE-C, 2 degree observer). Other similar coordinates may be equivalently used such as by the subscript "h" to signify the conventional use of the Hunter Lab Scale, or Ill. CIE-C, 10° observer, or the CIE LUV u*v* coordinates. These scales are defined herein according to ASTM D-2244-93 "Standard Test Method for Calculation of Color Differences From Instrumentally Measured Color Coordinates" Sep. 15, 1993 as augmented by ASTM E-308-85, Annual Book of ASTM Standards, Vol. 06.01 "Standard Method for Computing the Colors of Objects by 10 Using the CIE System" and/or as reported in IES LIGHTING HANDBOOK 1981 Reference Volume.

The terms "emittance" and "transmittance" are well understood in the art and are used herein according to their well known meaning. Thus, for example, the terms visible light transmittance (TY), infrared radiation transmittance, and ultraviolet radiation transmittance ($T_{uv}$) are known in the art. Total solar energy transmittance (TS) is then usually characterized as a weighted average of these values from 300 to 2500 nm (UV, visible and near IR). With respect to these transmittances, visible transmittance (TY), as reported herein, is characterized by the standard CIE Illuminant C, 2 degree observer, technique at 380–720 nm; near-infrared is 720–2500 nm; ultraviolet is 300–380 nm; and total solar is 300–2500 nm. For purposes of emittance, however, a particular infrared range (i.e. 2,500–40,000 nm) is employed.

Visible transmittance can be measured using known, conventional techniques. For example, by using a spectrophotometer, such as a Perkin Elmer Lambda 900 or Hitachi U4001, a spectral curve of transmission is obtained. Visible transmission is then calculated using the aforesaid ASTM 308/2244-93 methodology. A lesser number of wavelength points may be employed than prescribed, if desired. Another technique for measuring visible transmittance is to employ a spectrometer such as a commercially available Spectrogard spectrophotometer manufactured by Pacific Scientific Corporation. This device measures and reports visible transmittance directly. As reported and measured herein, visible transmittance (i.e. the Y value in the CIE tristimulus system, ASTM E-308-85) uses the Ill. C.,2 degree observer.

Another term employed herein is "sheet resistance". Sheet resistance ($R_s$) is a well known term in the art and is used herein in accordance with its well known meaning. It is here reported in ohms per square units. Generally speaking, this term refers to the resistance in ohms for any square of a layer system on a glass substrate to an electric current passed through the layer system. Sheet resistance is an indication of how well the layer or layer system is reflecting infrared energy, and is thus often used along with emittance as a measure of this characteristic. "Sheet resistance" may for example be conveniently measured by using a 4-point probe ohmmeter, such as a dispensable 4-point resistivity probe with a Magnetron Instruments Corp. head, Model M-800 produced by Signatone Corp. of Santa Clara, Calif.

The terms "heat treatment" and "heat treating" as used herein mean heating the article to a temperature sufficient to enabling thermal tempering, bending, and/or heat strengthening of the glass inclusive article. This definition includes, for example, heating a coated article to a temperature of at least about 580 or 600 degrees C. for a sufficient period to enable tempering and/or heat strengthening. In some instances, the HT may be for at least about 4 or 5 minutes.

Once given the above disclosure many other features, modifications and improvements will become apparent to the skilled artisan. Such other features, modifications and improvements are therefore considered to be a part of this invention, the scope of which is to be determined by the following claims:

What is claimed is:

1. A coated article including a layer system supported by a substrate, the layer system comprising:
    a first dielectric layer;
    a layer comprising an oxide of niobium zirconium (NbZr) provided on the substrate over at least the first dielectric layer;
    a second dielectric layer provided on the substrate over at least the layer comprising the oxide of niobium zirconium; and
    wherein the coated article has no metallic infrared (IR) reflecting layer comprising Ag or Au.

2. The coated article of claim 1, wherein the layer comprising the oxide of niobium zirconium is sandwiched between and contacts each of the first and second dielectric layers.

3. A coated article including a layer system supported by a substrate, the layer system comprising:
    a first dielectric layer;
    a layer comprising an oxide of niobium zirconium (NbZr) provided on the substrate over at least the first dielectric layer;
    a second dielectric layer provided on the substrate over at least the layer comprising the oxide of niobium zirconium; and
    wherein each of the dielectric layers comprises a nitride and/or a metal oxide.

4. The coated article of claim 1, wherein at least one of the first and second dielectric layers comprises silicon nitride.

5. The coated article of claim 1, wherein each of the first and second dielectric layers comprises silicon nitride.

6. A coated article including a layer system supported by a substrate, the layer system comprising:
    a first dielectric layer;
    a layer comprising an oxide of niobium zirconium (NbZr) provided on the substrate over at least the first dielectric layer;
    a second dielectric layer provided on the substrate over at least the layer comprising the oxide of niobium zirconium; and
    wherein a contact or nucleation layer is provided between the layer comprising the oxide of niobium zirconium and the first dielectric layer.

7. A coated article including a layer system supported by a substrate, the layer system comprising:
    a first dielectric layer;
    a layer comprising an oxide of niobium zirconium (NbZr) provided on the substrate over at least the first dielectric layer;
    a second dielectric layer provided on the substrate over at least the layer comprising the oxide of niobium zirconium; and
    wherein the layer comprising the oxide of niobium zirconium comprises from 0.05 to 10% oxygen.

8. The coated article of claim 1, wherein the coated article has a visible transmission from about 6 to 80%.

9. A coated article including a layer system supported by a substrate, the layer system comprising:
   a first dielectric layer;
   a layer comprising an oxide of niobium zirconium (NbZr) provided on the substrate over at least the first dielectric layer;
   a second dielectric layer provided on the substrate over at least the layer comprising the oxide of niobium zirconium; and
   wherein the coated article has a visible transmission of from about 10–50%.

10. The coated article of claim 9, wherein the coated article has a visible transmission of from about 12–30%.

11. The coated article of claim 1, wherein the coated article is a window.

12. The coated article of claim 1, wherein the layer system has a sheet resistance ($R_s$) of less than 250 ohms/square.

13. The coated article of claim 1, wherein the layer system has a sheet resistance ($R_s$) of less than 100 ohms/square.

14. The coated article of claim 1, wherein the layer system has a sheet resistance ($R_s$) of less than 60 ohms/square.

15. A coated article including a layer system supported by a substrate, the layer system comprising:
   a first dielectric layer;
   a layer comprising an oxide of niobium zirconium (NbZr) provided on the substrate over at least the first dielectric layer;
   a second dielectric layer provided on the substrate over at least the layer comprising the oxide of niobium zirconium; and
   wherein the layer comprising the oxide of niobium zirconium is at least partially nitrided.

16. A coated article including a layer system supported by a substrate, the layer system comprising:
   a first dielectric layer;
   a layer comprising an oxide of niobium zirconium (NbZr) provided on the substrate over at least the first dielectric layer;
   a second dielectric layer provided on the substrate over at least the layer comprising the oxide of niobium zirconium; and
   wherein the layer comprising the oxide of niobium zirconium comprises $(Nb+Zr)_xO_y$, where the ratio y/x (i.e., the ratio of oxygen to Nb+Zr) is from 0.03 to 0.20.

17. The coated article of claim 16, wherein the layer comprising the oxide of niobium zirconium comprises $(Nb+Zr)_xO_y$, where the ratio y/x (i.e., the ratio of oxygen to Nb+Zr) is from 0.05 to 0.15.

18. A coated article including a layer system supported by a substrate, the layer system comprising:
   a first dielectric layer;
   a layer comprising an oxide of niobium zirconium (NbZr) provided on the substrate over at least the first dielectric layer;
   a second dielectric layer provided on the substrate over at least the layer comprising the oxide of niobium zirconium; and
   wherein in the layer comprising the oxide of niobium zirconium, the ratio of zirconium to niobium (Zr/Nb) is from about 0.004 to 0.50.

19. The coated article of claim 1, wherein the layer comprising the oxide of niobium zirconium includes from about 0.4 to 15% zirconium.

20. A coated article including a layer system supported by a substrate, the layer system comprising:
   a first dielectric layer;
   a layer comprising an oxide of niobium zirconium (NbZr) provided on the substrate over at least the first dielectric layer;
   a second dielectric layer provided on the substrate over at least the layer comprising the oxide of niobium zirconium; and
   wherein the coated article is heat treated and has a $\Delta E^*$ value (glass side reflective) of no greater than 4.0 after and/or due to heat treatment.

21. The coated article of claim 1, wherein the coated article is heat treated and has a $\Delta E^*$ value (glass side reflective) of no greater than 4.0 after and/or due to heat treatment.

22. The coated article of claim 1, wherein the coated article is heat treated and has a $\Delta E^*$ value (glass side reflective) of no greater than 2.5 after and/or due to heat treatment.

23. The coated article of claim 1, wherein the coated article is heat treated and has a $\Delta E^*$ value (glass side reflective) of no greater than 1.5 after and/or due to heat treatment.

24. The coated article of claim 1, wherein the coated article is heat treated and has a $\Delta E^*$ value (glass side reflective) of no greater than 1.0 after and/or due to heat treatment.

25. A coated article including a layer system supported by a substrate, the layer system comprising:
   a first dielectric layer;
   a layer comprising an oxide of niobium zirconium (NbZr) provided on the substrate over at least the first dielectric layer;
   a second dielectric layer provided on the substrate over at least the layer comprising the oxide of niobium zirconium; and
   wherein the layer system consists essentially of the first and second dielectric layers and the layer comprising the oxide of niobium zirconium.

26. The coated article of claim 1, wherein the coated article comprises an IG window unit, a monolithic window, or a laminated window.

27. A coated article including a layer system supported by a substrate, the layer system comprising:
   a first dielectric layer;
   a layer comprising an oxide of niobium zirconium (NbZr) provided on the substrate over at least the first dielectric layer;
   a second dielectric layer provided on the substrate over at least the layer comprising the oxide of niobium zirconium; and
   wherein at least one of the dielectric layers comprises silicon nitride and includes from 6–20% aluminum and/or stainless steel.

28. A coated article including a layer system supported by a substrate, the layer system comprising:
   a first dielectric layer;
   a layer comprising an oxide of niobium zirconium (NbZr) provided on the substrate over at least the first dielectric layer;
   a second dielectric layer provided on the substrate over at least the layer comprising the oxide of niobium zirconium; and wherein the layer comprising the oxide of niobium zirconium does not contact any metallic infrared (IR) reflecting layer of Ag or Au.

29. The coated article of claim 1, wherein the coated article is not heat treated.

30. The coated article of claim 1, wherein the substrate is a glass substrate.

31. The coated article of claim 1, wherein the layer comprising the oxide of niobium zirconium has an index of refraction "n" of from 2.4 to 2.9, an extinction coefficient "k" of from 3.3 to 3.8, and comprises from about 0.1 to 60% Zr.

32. A heat treated coated article including a layer system supported by a glass substrate, the layer system comprising:
   a layer comprising an oxide of niobium zirconium (NbZr) provided on the glass substrate;
   a dielectric layer provided on the substrate over at least the layer comprising the oxide of niobium zirconium; and
   wherein the coated article is heat treated and has a ΔE* value (glass side reflective) of no greater than 3.0 after and/or due to heat treatment.

33. The coated article of claim 32, wherein the coated article has a ΔE* value (glass side reflective) of no greater than 2.5 after and/or due to heat treatment.

34. The coated article of claim 32, wherein the coated article has a ΔE* value (glass side reflective) of no greater than 1.5 after and/or due to heat treatment.

35. The coated article of claim 32, further comprising a layer comprising silicon nitride located between the glass substrate and the layer comprising niobium zirconium.

36. The coated article of claim 32, wherein the layer comprising the oxide of niobium zirconium comprises $(Nb+Zr)_xO_y$, where the ratio y/x (i.e., the ratio of oxygen to Nb+Zr) is from 0.03 to 0.20.

37. The coated article of claim 36, wherein the layer comprising the oxide of niobium zirconium does not contact any metallic infrared (IR) reflecting layer comprising Ag or Au.

38. The coated article of claim 1, wherein the second dielectric layer over at least the layer comprising the oxide of niobium zirconium comprises nitrogen, and wherein oxygen content in the layer comprising the oxide of niobium zirconium is higher at a location closer to the second dielectric layer than at another location in the layer comprising the oxide of niobium zirconium further from the second dielectric layer.

39. The coated article of claim 3, wherein the layer comprising the oxide of niobium zirconium does not contact any metallic infrared (IR) reflecting layer of Ag or Au.

40. The coated article of claim 6, wherein the layer comprising the oxide of niobium zirconium does not contact any metallic infrared (IR) reflecting layer of Ag or Au.

41. The coated article of claim 7, wherein the layer comprising the oxide of niobium zirconium does not contact any metallic infrared (IR) reflecting layer of Ag or Au.

42. The coated article of claim 9, wherein the layer comprising the oxide of niobium zirconium does not contact any metallic infrared (IR) reflecting layer of Ag or Au.

43. The coated article of claim 16, wherein the layer comprising the oxide of niobium zirconium does not contact any metallic infrared (IR) reflecting layer of Ag or Au.

44. The coated article of claim 18, wherein the layer comprising the oxide of niobium zirconium does not contact any metallic infrared (IR) reflecting layer of Ag or Au.

45. The coated article of claim 20, wherein the layer comprising the oxide of niobium zirconium does not contact any metallic infrared (IR) reflecting layer of Ag or Au.

46. The coated article of claim 27, wherein the layer comprising the oxide of niobium zirconium does not contact any metallic infrared (IR) reflecting layer of Ag or Au.

47. The coated article of claim 1, wherein the coated article has a visible transmission of from about 10–50%.

48. The coated article of claim 3, wherein the coated article has a visible transmission of from about 10–50%.

49. The coated article of claim 7, wherein the coated article has a visible transmission of from about 10–50%.

50. The coated article of claim 16, wherein the coated article has a visible transmission of from about 10–50%.

51. The coated article of claim 18, wherein the coated article has a visible transmission of from about 10–50%.

52. The coated article of claim 20, wherein the coated article has a visible transmission of from about 10–50%.

53. The coated article of claim 27, wherein the coated article has a visible transmission of from about 10–50%.

54. The coated article of claim 28, wherein the coated article has a visible transmission of from about 10–50%.

55. The coated article of claim 1, wherein a contact or nucleation layer is provided between the layer comprising the oxide of niobium zirconium and the first dielectric layer, and/or between the layer comprising the oxide of niobium zirconium and the second dielectric layer.

56. The coated article of claim 20, wherein a contact or nucleation layer is provided between the layer comprising the oxide of niobium zirconium and the first dielectric layer, and/or between the layer comprising the oxide of niobium zirconium and the second dielectric layer.

57. The coated article of claim 28, wherein a contact or nucleation layer is provided between the layer comprising the oxide of niobium zirconium and the first dielectric layer, and/or between the layer comprising the oxide of niobium zirconium and the second dielectric layer.

58. The coated article of claim 1, wherein the coated article is heat treated and has a ΔE* value (glass side reflective) of no greater than 4.0 after and/or due to heat treatment.

59. The coated article of claim 3, wherein the coated article is heat treated and has a ΔE* value (glass side reflective) of no greater than 4.0 after and/or due to heat treatment.

60. The coated article of claim 6, wherein the coated article is heat treated and has a ΔE* value (glass side reflective) of no greater than 4.0 after and/or due to heat treatment.

61. The coated article of claim 7, wherein the coated article is heat treated and has a ΔE* value (glass side reflective) of no greater than 4.0 after and/or due to heat treatment.

62. The coated article of claim 9, wherein the coated article is heat treated and has a ΔE* value (glass side reflective) of no greater than 4.0 after and/or due to heat treatment.

63. The coated article of claim 16, wherein the coated article is heat treated and has a ΔE* value (glass side reflective) of no greater than 4.0 after and/or due to heat treatment.

64. The coated article of claim 18, wherein the coated article is heat treated and has a ΔE* value (glass side reflective) of no greater than 2.5 after and/or due to heat treatment.

65. The coated article of claim 25, wherein the coated article is heat treated and has a ΔE* value (glass side reflective) of no greater than 4.0 after and/or due to heat treatment.

66. The coated article of claim 27, wherein the coated article is heat treated and has a ΔE* value (glass side reflective) of no greater than 2.5 after and/or due to heat treatment.

67. The coated article of claim 28, wherein the coated article is heat treated and has a ΔE* value (glass side reflective) of no greater than 4.0 after and/or due to heat treatment.

68. The coated article of claim 28, wherein the coated article is heat treated and has a ΔE* value (glass side reflective) of no greater than 2.5 after and/or due to heat treatment.

69. The coated article of claim 1, wherein the layer system consists essentially of the first and second dielectric layers and the layer comprising the oxide of niobium zirconium.

70. The coated article of claim 3, wherein the layer system consists essentially of the first and second dielectric layers and the layer comprising the oxide of niobium zirconium.

71. The coated article of claim 7, wherein the layer system consists essentially of the first and second dielectric layers and the layer comprising the oxide of niobium zirconium.

72. The coated article of claim 16, wherein the layer system consists essentially of the first and second dielectric layers and the layer comprising the oxide of niobium zirconium.

73. The coated article of claim 20, wherein the layer system consists essentially of the first and second dielectric layers and the layer comprising the oxide of niobium zirconium.

74. The coated article of claim 27, wherein the layer system consists essentially of the first and second dielectric layers and the layer comprising the oxide of niobium zirconium.

75. The coated article of claim 28, wherein the layer system consists essentially of the first and second dielectric layers and the layer comprising the oxide of niobium zirconium.

* * * * *